(12) United States Patent
Huang

(10) Patent No.: US 6,198,173 B1
(45) Date of Patent: Mar. 6, 2001

(54) SRAM WITH IMPROVED BETA RATIO

(75) Inventor: Jenn Ming Huang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/196,588

(22) Filed: Nov. 20, 1998

Related U.S. Application Data

(62) Division of application No. 08/958,428, filed on Oct. 27, 1997, now Pat. No. 5,872,030.

(51) Int. Cl.$^7$ .............................. H01L 27/11; H01L 29/76
(52) U.S. Cl. ....................... 257/903; 257/344; 257/408
(58) Field of Search .................................. 257/536, 379, 257/903, 904, 368, 369, 336, 344, 408; 438/210, 382

(56) References Cited

U.S. PATENT DOCUMENTS

| | | |
|---|---|---|
| 5,395,773 | 3/1995 | Ravindhran et al. ............. 438/217 |
| 5,492,847 | 2/1996 | Rao et al. ........................ 438/302 |
| 5,504,023 | 4/1996 | Hong ............................... 438/305 |
| 5,534,447 | 7/1996 | Hong ............................... 438/305 |
| 5,595,919 | 1/1997 | Pan ................................. 438/302 |
| 5,656,861 | 8/1997 | Godinho et al. ................. 257/904 |
| 5,847,434 | * 12/1998 | Onozawa ........................ 257/903 |
| 5,880,496 | 3/1999 | Chen et al. ..................... 257/296 |
| 5,955,746 | 9/1999 | Kim ................................ 257/904 |

* cited by examiner

Primary Examiner—Steven Loke
Assistant Examiner—Hung Kim Vu
(74) Attorney, Agent, or Firm—George O. Saile; Stephen B. Ackerman; Graham S. Jones, II

(57) ABSTRACT

A method of forming an SRAM transistor cell on a doped semiconductor substrate with a halo region in transistors thereof by the steps including well formation, field isolation formation, threshold voltage implant, gate oxidation; deposition of polysilicon and patterning thereof into gate electrode; post etching anneal; N type LDD photolithography and ion implanting NMOS transistor devices; ion implant halo regions in a transistor; P type LDD photolithography and ion implanting PMOS transistor devices; spacer formation; N+ source/drain photolithography and ion implanting; and P+ source/drain photolithography and ion implanting.

7 Claims, 5 Drawing Sheets

US 6,198,173 B1

SRAM WITH IMPROVED BETA RATIO

This is a division of patent application Ser. No. 08/958,428, filing date Oct. 27, 1997, U.S. Pat. No. 5,872,030 Method Of Improving Beta Ratio In Sram And Device Manufactured Thereby, assigned to the same assignee as the present invention.

BACKGROUND OF THE INVENTION

1. Field of the Invention

This invention relates to semiconductor memory devices and more particularly to a method of manufacturing Static Random Access Memory (SRAM) devices cell with an enhanced Beta ratio and improved cell stability.

2. Description of Related Art

U.S. Pat. No. 5,395,773 of Ravindhran shows a method of forming a gate penetrating halo implant.

U.S. Pat. No. 5,595,919 of Pan shows another self-aligned halo method.

U.S. Pat. No. 5,534,447 of Hong, U.S. Pat. No. 5,504,023 of Hong, U.S. Pat. No. 5,492,847 of Kao all show halo self-aligned methods. However, these references do not teach the B-implant halo process of the invention.

SUMMARY OF THE INVENTION

Beta Ratio

Processing of a polysilicon load SRAM is easy and the cell is the smallest in size, which are both factors which reduce manufacturing cost. But the problem is to to produce an SRAM device which has a high enough Beta ratio ($\beta = I_{pull-down}/I_{pass-gate}$) within finite dimensions in the deep-submicron regime. Using conventional approaches, the yield obtained is too marginal. The Beta ratio is generally about 3.5 to achieve better cell stability.

The pass-gate transistor of an SRAM cell is implemented by an extra implant of dopant, such as boron ($B_{11}$), to form a halo structure.

This invention increases the Beta ratio in an SRAM cell to obtain high cell operation stability. It makes it possible to reduce the channel length of the pass-gate transistors without impacting the Beta ratio to obtain a smaller cell size or increase the width of pull-down transistor to obtain a wider field isolation process (such as a LOCOS) window. It also makes it possible to suppress the $I_{off}$ current of a pass-gate transistor. The present invention shows a method of implanting boron to form a halo structure in a pass-gate transistor of an SRAM cell.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 2:
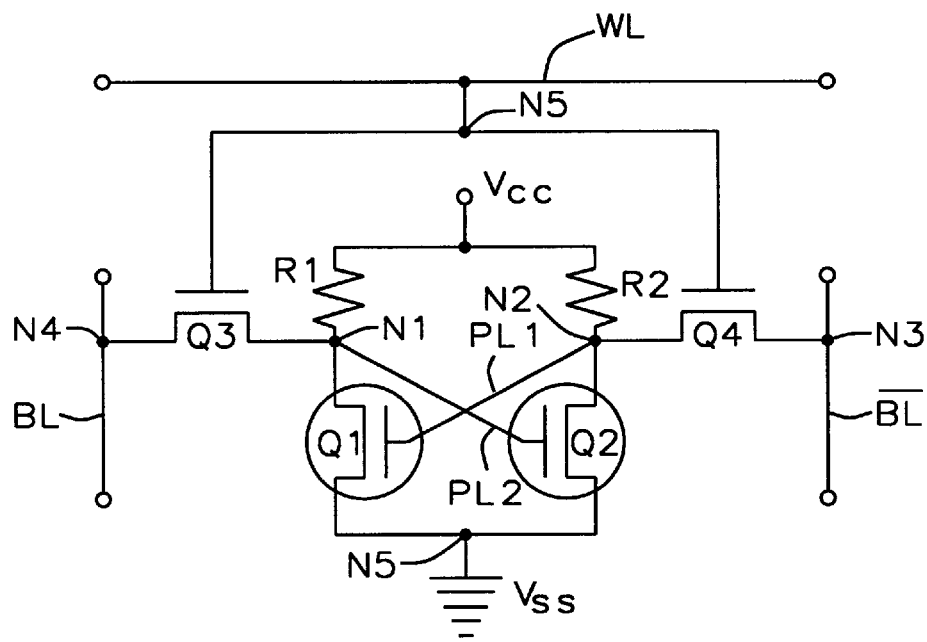
FIG. 2 shows a four transistor SRAM cell of the kind employed in connection with this invention with cross-coupled storage (driver/pull down transistors) NMOS transistors, a pair of polysilicon load resistors and pass (access/transistor) NMOS transistors.

FIG. 2 shows a four transistor SRAM cell with cross-coupled storage (driver/pull down transistors) NMOS transistors Q1 and Q2, a pair of polysilicon load resistors R1, R2 and pass (access/transistor) NMOS transistors Q3 and Q4.

Load resistors R1 and R2 are connected between power supply voltage Vcc and nodes N1 and N2 respectively. A current $I_1$ flows from a terminal Vcc through a first load resistor R1 towards node N1. A second current $I_2$ flows from the terminal Vcc through a second load resistor R2 towards node N2.

NMOS storage transistors Q1 and Q2 are devices which have their drain regions connected respectively to nodes N1 and N2 and their control gate electrodes cross-coupled respectively via lines PL1 and PL2 to nodes N2 and N1. The source regions of transistors Q1 and Q2 are connected via node N5 to ground, i.e. reference potential.

Node N1 is connected via a contact to the drain region of transistor Q1 and to the control gate electrode of transistor Q2. Load resistor R1 is connected between power supply voltage Vcc via node N1 and the contact to the drain of transistor Q1.

Node N2 is connected via a contact to the drain region of transistor Q2 and to the control gate electrode of transistor Q1. Load resistor R2 is connected between power supply voltage Vcc and via node N2 through the contact to the drain of transistor Q2.

NMOS pass transistors Q3 and Q4 both have their control gate electrodes connected to the wordline WL via nodes N5.

Pass transistor Q3 has its control gate electrode connected to wordline WL and its source/drain (S/D) circuit connected between node N1 and and node N4, and is connected via node N4 to bit line BL.

Pass transistor Q4 has its control gate electrode connected to wordline WL and its S/D circuit connected between node N2 and node N3, and is connected via node N3 to bit line BL-bar.

Load resistors R1 and R2 have resistance values in the range of $10^7$ ohms to $10^{13}$ ohms which permits more substantial currents I1 and I2 in the range of microamperes ($10^{-6}$) to picoamperes ($10^{-12}$).

Process Flow

Figure 1:
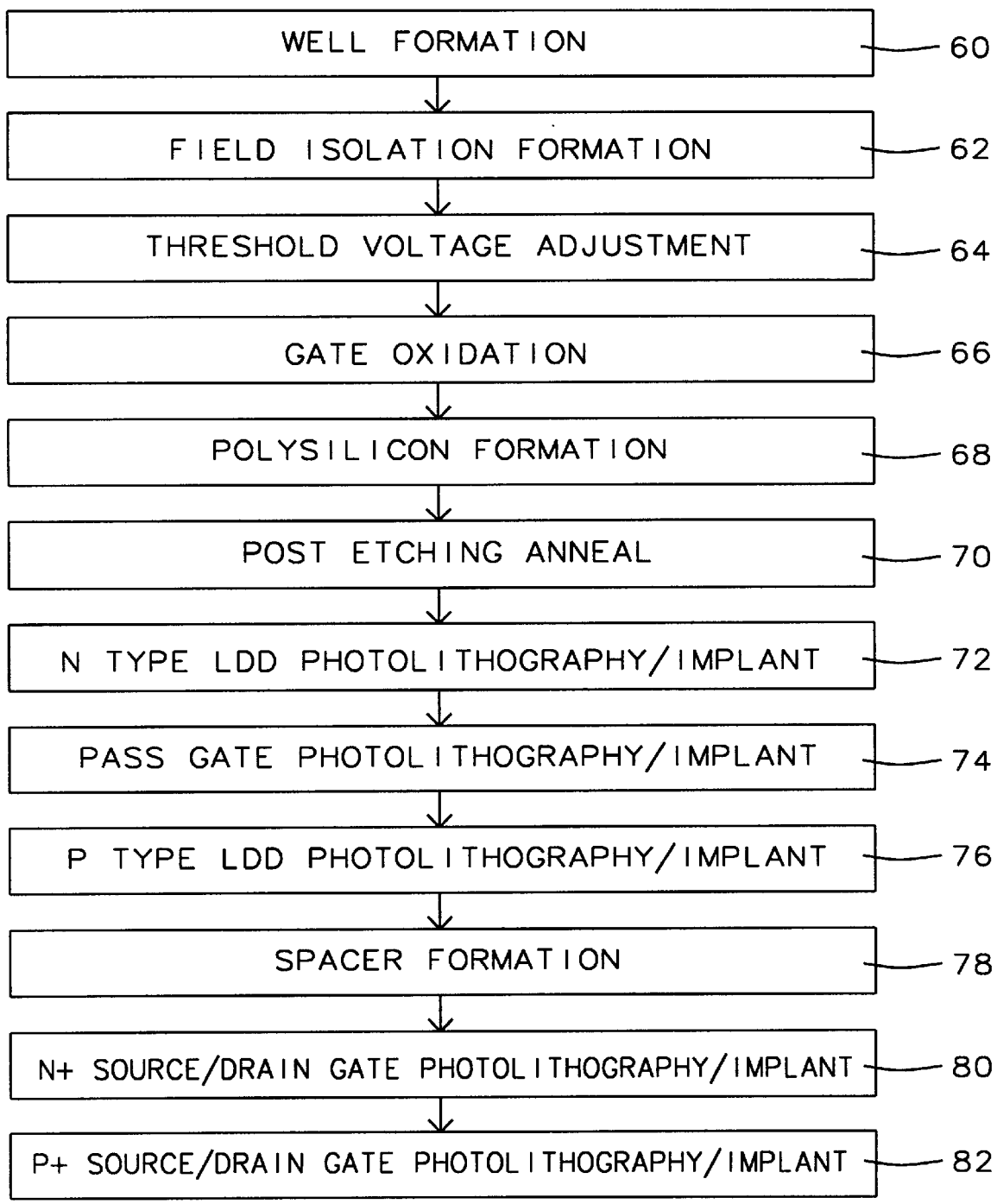
FIG. 1 is a process flow chart for the steps employed to produce a pass transistor in accordance with this invention.

FIG. 1 is the process flow chart for the steps employed to produce a pass transistor in accordance with this invention. Referring to the SRAM schematic circuit seen in FIG. 2, the pass transistor Q4 is exemplary of type of pass transistor which is provided for an SRAM cell. FIGS. 3A–3G show cross sections of various stages of manufacture of portions of a CMOS cell 8 including an SRAM cell in accordance with this invention.

In particular, referring again to FIG. 1 and FIGS. 3A–3G, the processing steps are described below. The results of steps 1–4 are shown in FIG. 3A.

1. Well formation

Figure 3A:
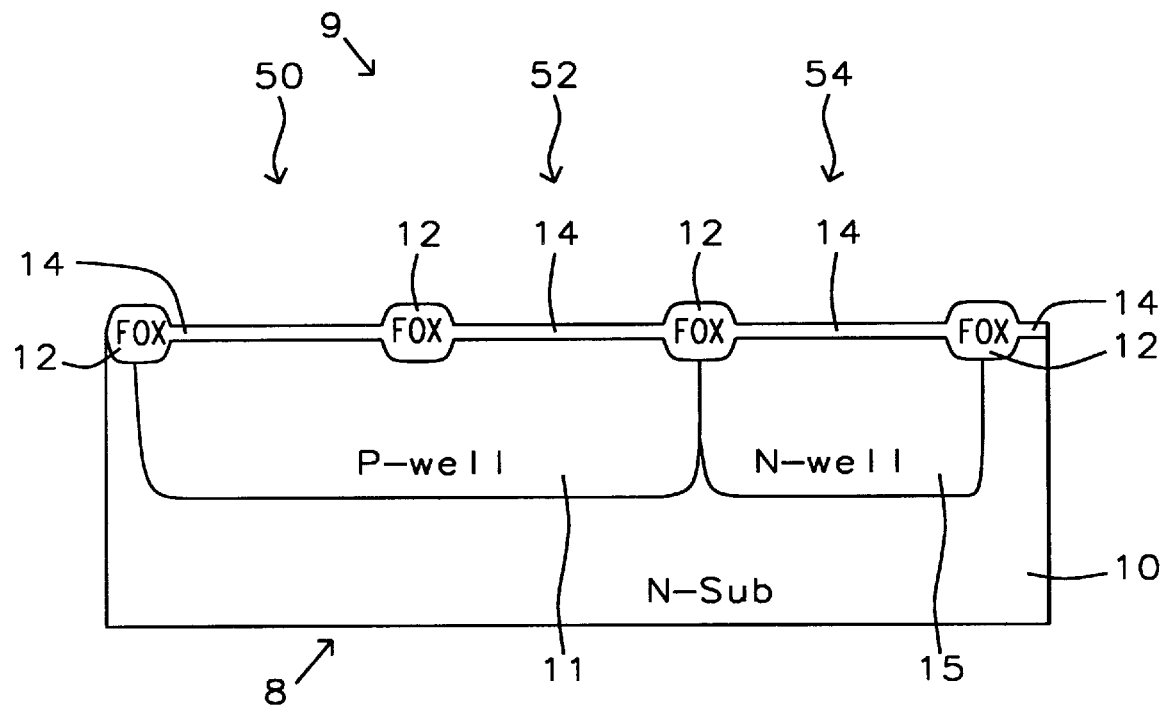
FIGS. 3A–3G show a cross section of a CMOS device with a cell in accordance with this invention in various stages of manufacture.

Referring to step 60 in FIG. 1, FIG. 3A shows a device 8 in a very early stage in the process of manufacture which includes a N-doped silicon semiconductor substrate 10 in which a set of wells including a P-well 11 and an N-well 15 have been formed. P-well 11 is prepared for the manufacture of an SRAM cell 9 including the site prepared for a pull down transistor 50 and the site prepared for a pass transistor 52 to be formed in P-well 11. Device 8 as shown in FIG. 3A also includes the site prepared for a future peripheral PMOS transistor 54 which is also in an early stage of manufacture. The P-well 11 was doped with a concentration of boron dopant from about 1 E 16 atoms/cm³ to about 1 E 17 atoms/cm$^3$ by the process of ion implantation. The N-well 15 was doped with a conventional N type dopant to a conventional level, as will be well understood by those skilled in the art.

2. Field Isolation Formation

In step 62, in FIG. 1 field isolation is provided in the form of field oxide (FOX) regions 12 formed on the surface of device 8 as shown in FIG. 3A by the steps of forming a silicon nitride mask (not shown) with openings for patterning the regions 12 followed by thermal oxidation through the openings to form silicon oxide field oxide (FOX) regions 12.

The FOX regions 12 frame the sites of pull down transistor 50, pass transistor 52 and peripheral PMOS transistor 54, with one FOX region 12 located at the interface between P-well 11 and N-well 15.

Then, after formation of the FOX regions 12, the silicon nitride mask is stripped.

3. V$_t$ Implant

In step 64, in FIG. 1 there is a maskless threshold voltage adjustment made in the future channel regions of P-well 11 and N-well 15 by the steps of ion implantation of BF$_2$ dopant from about 1 E 12 ions/cm$^2$ to about 1 E 13 ions/cm$^2$ at an energy from about 15 keV to about 50 keV, resulting in a concentration of boron (B) dopant from about 1 E 17 atoms/cm$^3$ to about 1 E 18 atoms/cm$^3$.

4. Gate oxidation

In step 66, a gate oxide (silicon oxide) layer 14 is formed over the surface of P-well 11 and N-well 15, as shown in FIG. 3A. Gate oxide (silicon oxide) layer 14 has a thickness from about 40 Å to about 200 Å, and layer 14 is formed by thermal oxidation using conventional processing apparatus and parameters, as will be well understood by those skilled in the art.

5. Polysilicon Layer (Gate) Formation

Figure 3B:
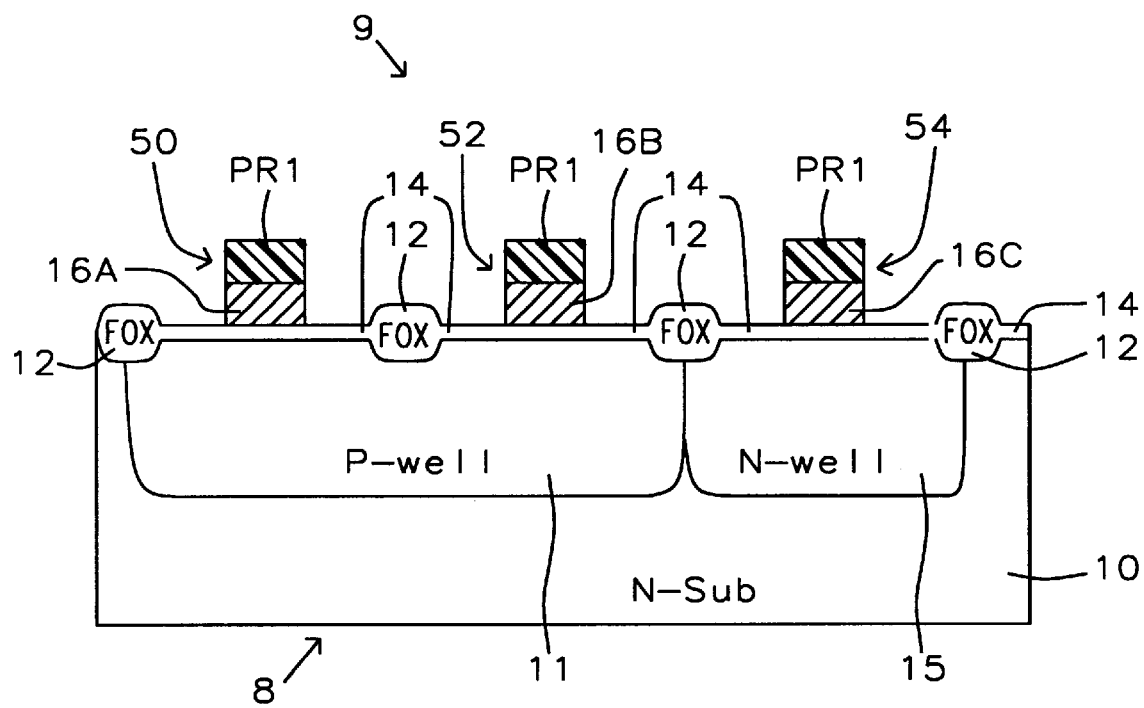

Referring to FIG. 3B, in step 68, a blanket doped polysilicon layer 16 with a thickness from about 1,000 Å to about 3,000 Å was formed over the gate oxide layer 14 by the steps of in-situ deposition of doped polysilicon.

Then polysilicon layer 16 was patterned by photoresist mask PR1 and etched into a set of electrically conductive, gate electrode 16A for pull down transistor 50 and gate electrode 16B for pass transistor 52 respectively in P-well 11 and gate electrode 16C in N-well 15 for transistor 54 as shown in FIG. 3B. Gate electrode 16A of pull down transistor 50 and gate electrode 16B of pass transistor 52 are formed on opposite sides of a FOX region 12.

Figure 3C:
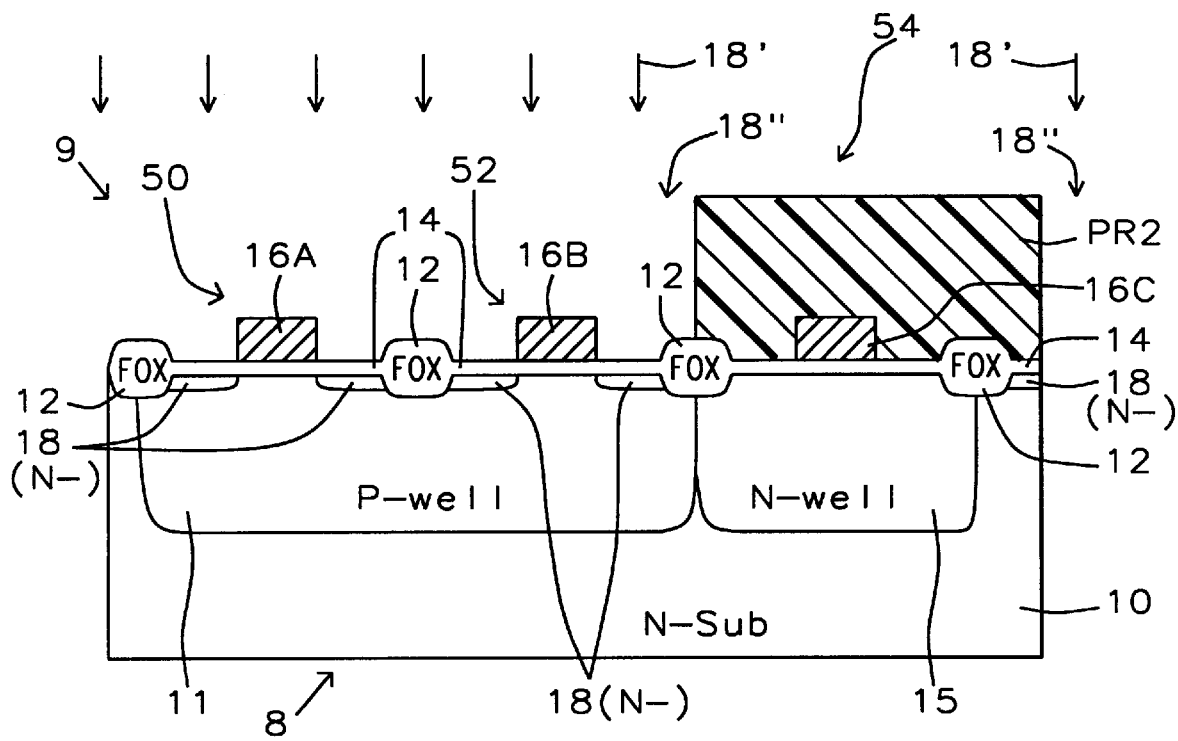

The photoresist mask PR1 was then stripped from the device, as seen in FIG. 3C.

6. Post Etching Anneal

Referring again to FIG. 3C, in step 70, after photoresist mask PR1 was stripped from the device 8, the device 8 was annealed at a temperature from about 800° C. to about 900° C. for a time from about 30 minutes to about 60 minutes for the purpose of annealing the polysilicon etching damage.

7. N Channel LDD Photolithography/Implant

In step 72, as shown in FIG. 3C, an N-type LDD mask PR2 (with windows 18" therethrough) has been formed over the N-well 15 and the cell 8 in P-well 11 of FIG. 3B is being ion implanted with N type dopant 18' for all NMOS transistors such as those to be formed in P-well 11 as well as the region on the right of mask PR2. During this step, second photoresist mask PR2 protects the N-well 15 from being doped with the N-type dopant 18'. The N-LDD regions 18 in P-well 11 are ion implanted with a dose of phosphorus N type dopant from about 1 E 13 ions/cm$^2$ to about 1 E 14 ions/cm$^2$ at an energy from about 20 keV to about 80 keV. After annealing, the phosphorus dopant in N type LDD regions 18 had a concentration from about 1 E 18 atoms/cm$^3$ to about 1 E 19 atoms/cm$^3$. Aside from the FOX regions 12, the N-LDD regions are self-aligned with the gate electrodes 16A and 16B.

8. Pass-Gate Photolithography/Implant

Figure 3D:
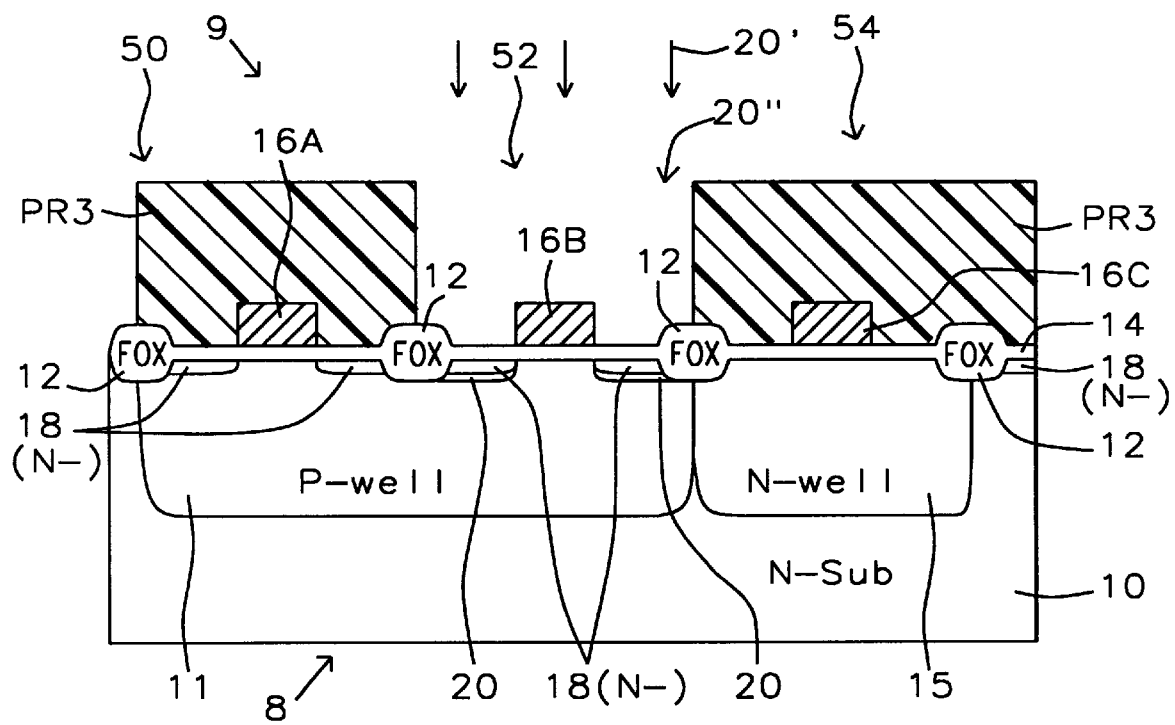

In step 74, referring to FIG. 3D, the device of FIG. 3C is shown during performance of a gate transistor halo implant of boron B$_{11}$ into regions 20 self-aligned with pass gate electrode 16A of pull-down transistor 50; and gate 16B of pass transistor 52 (which transistor 52 represents both of the transistors Q3 and Q4 in FIG. 2) to form boron doped halo implant regions 20. The regions 20 extend below the LDD regions 18 below the pass gate 16B in cell 9 of FIG. 3C as shown in FIG. 3D. Halo implant mask PR3 is formed with openings 20" only for the Q3 and Q4 pass transistors 52 in the SRAM cell. The halo regions 20 are ion implanted with a dose of boron (B$_{11}$) dopant ions 20' in a range from about 1 E 13 ions/cm$^2$ to about 1 E 14 ions/cm$^2$ at an energy from about 20 keV to about 80 keV. After annealing, the boron (B$_{11}$) dopant in halo regions 20 has a concentration of boron (B$_{11}$) dopant from about 1 E 18 atoms/cm$^3$ to about 1 E 19 atoms/cm$^3$.

Then the mask PR3 is stripped from the device 8.

9. P Channel LDD Photolithography/Implant

Figure 3E:
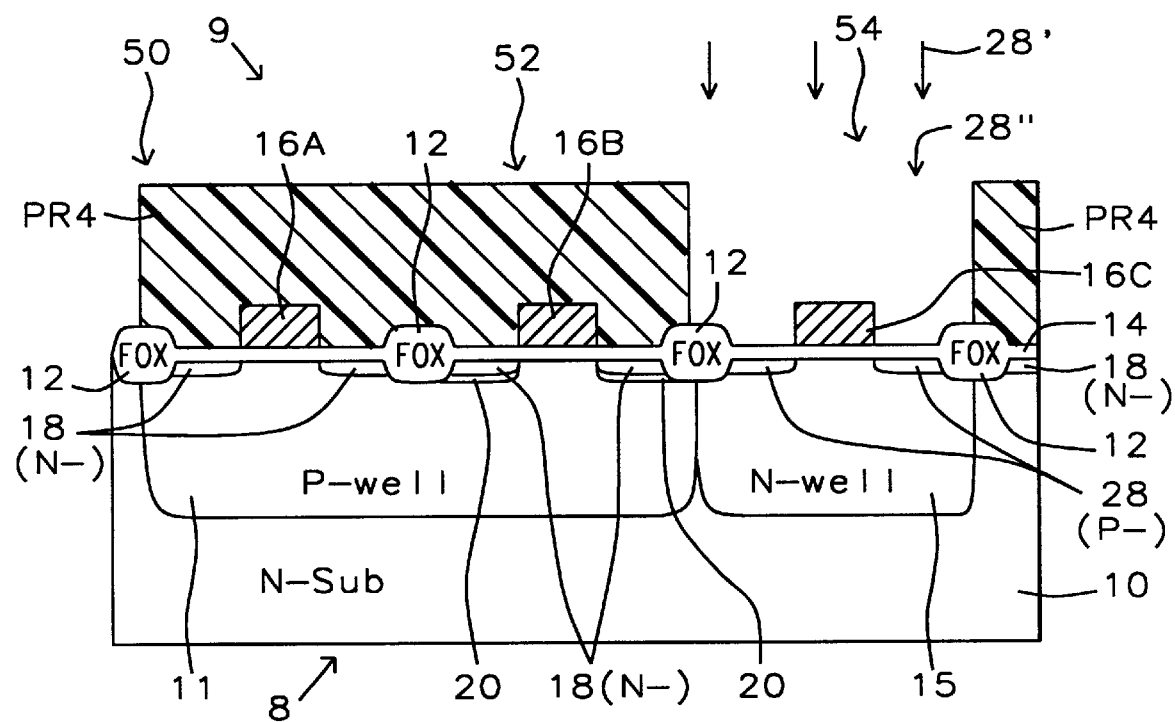

Referring to FIG. 3E which shows the product of FIG. 3D after the halo implant has been completed and during step 76 in which a mask PR4 is formed over device 8 with a window 28" exposing the peripheral PMOS transistor 54. P type dopant 28' is being being ion implanted through window 28" to form P-type LDD regions 28 self-aligned with gate electrode 16C for all PMOS transistors to be formed in N-well 15. The conventional P-type LDD photoresist mask PR4 protects the P-type well 11 from doping with P-type dopant 28'. The P-type LDD regions 28 are ion implanted with a dose of BF$_2$ dopant from about 1 E 13 ions/cm$^2$ to about 1 E 14 ions/cm$^2$ at an energy from about 10 keV to about 50 keV. After annealing, the boron dopant in the P type LDD regions has a concentration of boron dopant from about 1 E 18 atoms/cm$^3$ to about 1 E 19 atoms/cm$^3$.

Then the mask PR4 is stripped from the device 8.

10. Spacer Formation Peripheral

Figure 3F:
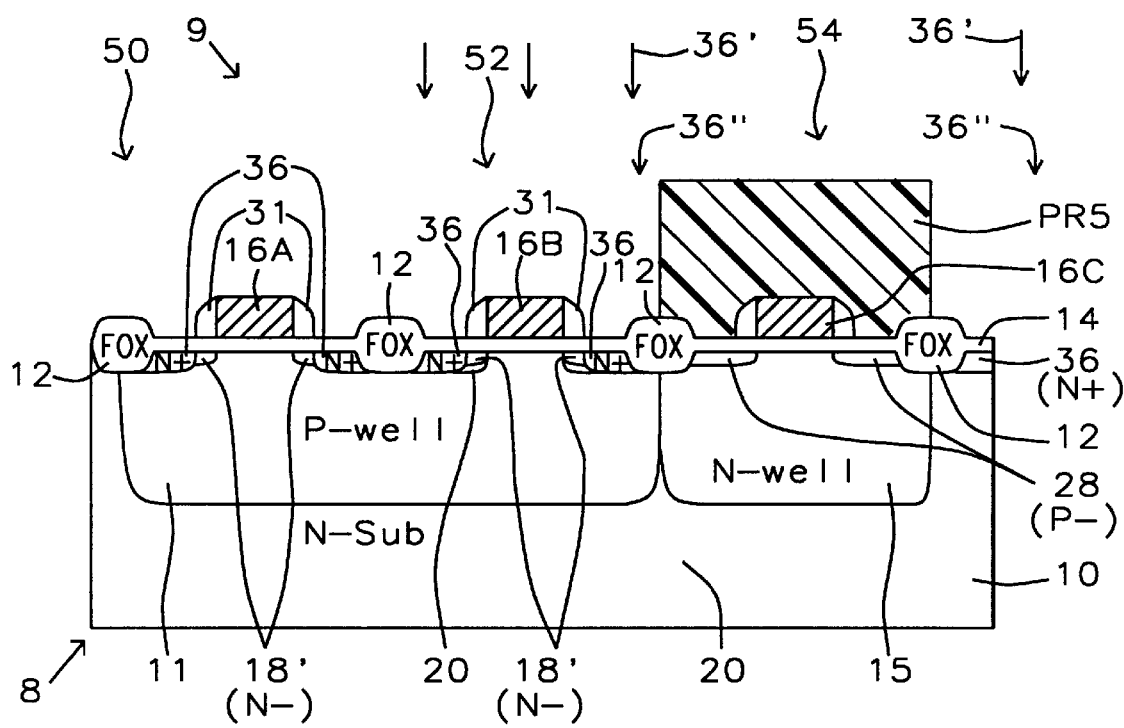
Figure 3G:
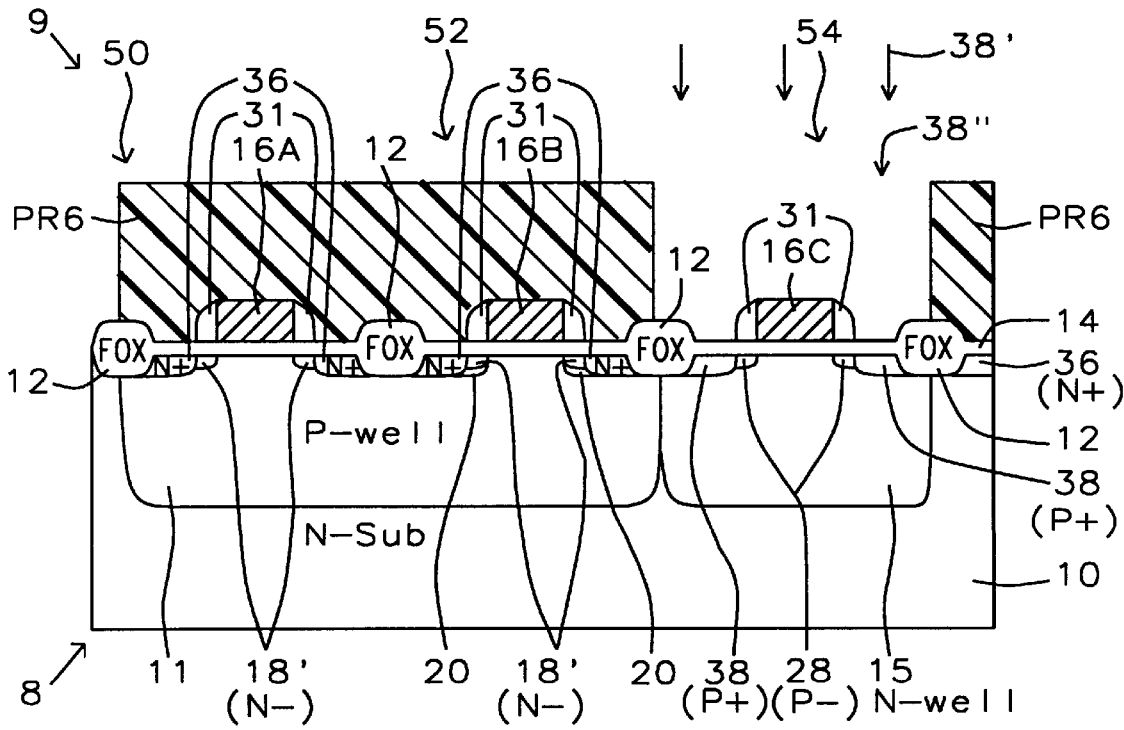

In step 78, silicon dioxide spacers 21 are formed adjacent to the sidewalls of the gate electrodes 16A, 16B and 16C. as shown in FIG. 3F of all three transistor devices 50, 52 and 54.

11. N+ Source/Drain Photolithography/Implant

In step 80, a mask PR5 is formed over the peripheral transistor devices 54 in N-well 15. There are windows 36" over the P-well 11 and aside from the N-well 15. N type dopant 36' is implanted into the the P-well 11 to form self-aligned source/drain regions 36 for each NMOS transistor 50 and 52.

The N type source/drain regions 36 are ion implanted with a dose of arsenic dopant from about 5 E 14 ions/cm² to about 5 E 15 ions/cm² at an energy from about 20 keV to about 60 keV. After annealing, source/drain regions 36 had a concentration of N type arsenic dopant from about 1 E 19 atoms/cm³ to about 1 E 20 atoms/cm³.

Then the mask PR5 is stripped from the device 8. The LDD regions 18' remain below the spacers 31 for both pull down transistor 50 and pass transistor 52, and in the case of pass transistor 52, the halo regions 20 remain below the LDD regions 18'.

12. P+Source/Drain Photolithography/Implant

In step 82 a mask PR6 is formed covering device 8 with a window over N-well 15. P type dopant 38' is implanted into the N-well 15 to form the P+ source/drain regions 38 of each PMOS device 54.

The P type source/drain regions 24 are ion implanted with a dose of $BF_2$ dopant from about 5 E 14 ions/cm² to about 5 E 15 ions/cm² at an energy from about 20 keV to about 60 keV. After annealing, the boron dopant in the N type source/drain regions 24 had a concentration of boron dopant from about 1 E 19 atoms/cm³ to about 1 E 20 atoms/cm³.

Table I shows data for devices N1–N8 showing how the device N7 is designed to simulate the behavior of a pass-gate transistor.

TABLE I

| CELL IMPLANT | | NONE | Halo Implant after N Channel LDD implant B 40 KeV 8E12 TO |
|---|---|---|---|
| VT_N1 EXT | V 20/20 | 0.625/.007 | 0.622/.006 |
| GAM_N1 | 20/20 | 0.622/.003 | 0.618/.002 |
| BET N1 | μA/V ·· 2 | 145.560/.797 | 145.480/.414 |
| Ioff_N1 | pA/μm | 2.140/.414 | 2.149/.442 |
| Leff_N346 | μm 20/0.5 | 0.569/0.12 | 0.732/.007 |
| Rser_N346 | ohm 20/.5 | 59.585/2.003 | 61.426/2.899 |
| VT_N3 EXT | V 20/0.5 | 0.637/.007 | 0.642/.004 |
| VT_N3 DI8 | SAT 20/0.5 | 0.596/.009 | 0.616/.008 |
| GAM_N3 | 20/0.5 | 0.489/.007 | 0.545/.008 |
| BET_N3 Slo | uA/V ·· 2 | 5193.067/145.32 | 4396.400/81.882 |
| Isat_N3 F | mA 20/0.5 | 6.873/.108 | 5.988/.080 |
| Isub_N3 | μA/μm | 0.250/.012 | 0.276/.012 |
| Ioff_N3 | pA/μm | 1.922/.303 | 1.820/.294 |
| BV_N3 | V 20/0.5 | 5.596/0. | 5.596/0. |
| SWI_N4 3.6 | mv/Dec. | 84.077/.609 | 85.544/.361 |
| VT_N4 | V 20/0.4 | 0.580/.017 | 0.616/.007 |
| Isat_N4 | mA 20/.4 | 7.736/.163 | 6.520/.117 |
| Ioff_N4 | pA/μm | 2.585/.663 | 2.031/.348 |
| ·Ioff_N4 | pA/μm | 85.951/131.906 | 3.515/.760 |
| BV_N4 | V 20/0.4 | 5.596/0. | 5.596/0. |
| SWI_N4 3.6 | mV/Dec. | 80.745/.944 | 82.924/.308 |
| VT_N5 EXT | V 20/.35 | 0.497/.032 | 0.555/.015 |
| Isat_N5 | mA 20/.35 | 8.498/.221 | 6.956/.156 |
| Ioff_N5 | pA/μm | 432.147/910.962 | 4.277/2.922 |
| ·Ioff_N4 | pA/μm | 0.000/0. | 839.662/1175.905 |
| BV_N5 | V 20/.35 | 3.498/1.524 | 5.596/0. |
| SWI_N5 3.6 | mv/Dec. | 79.536/.679 | 81.434/.623 |
| VT_N6 EXT | V. 4/20 AR | 0.547/.016 | 0.560/.006 |
| Weff_N646 | μm .4/20 | 0.359/.010 | 0.348/.014 |
| Ioff_N6 | pA .4/20 | 4.188/.677 | 4.105/.700 |
| VT_N7 EXT V | .4/0.5 AR | 0.590/.007 | 0.614/.006 |
| GAM_N7 | 0.4/0.5 | 0.540/.007 | 0.582/.004 |
| Isat N7 | mA .4/.5 AR | 0.159/.002 | 0.135/.004 |
| SWI_N7 | mv/Dec. | 85.987/.562 | 85.932/.416 |
| SWI_N7 3.6 | mV/Dec. | 85.877/.519 | 86.624/.564 |

TABLE I-continued

| CELL IMPLANT | | NONE | Halo Implant after N Channel LDD implant B 40 KeV 8E12 TO |
|---|---|---|---|
| Ioff_N7 | pA .4/.5 AR | 3.965/.610 | 4.010/.636 |
| VT_N8 EXT V | .3/0.5 AR | 0.541/.058 | 0.617/.128 |
| GAM_N8 | 0.3/0.5 | 0.539/.05 | 0.601/.097 |
| Isat_N8 | mA .3/.5 AR | .124/.015 | 0.101/.019 |
| SWI_N8 | mv/Dec. | 85.051/1.971 | 86.088/3.483 |
| SWI_N8 3.6 | mV/Dec. | 84.362/1.225 | 86.398/2.976 |
| Ioff_N8 | pA .3/.5 AR | 4.083/.736 | 3.748/.873 |

SYMBOLS & PARAMETERS

| Item | Device No. | Method | Unit | CHANNEL WIDTH CHANNEL LENGTH | DEFINITION |
|---|---|---|---|---|---|
| VT | N1 | EXT | V | 20/20 | Threshold voltage measurement by linear extrapolation |
| GAM | N1 | | | 20/20 | |
| BET | N1 | | μA/V ·· 2 | | |
| Ioff | N1 | | pA/μm | | The drain current as turns "OFF" |
| Leff | N346 | μm | | 20/0.5 | The effective channel |
| Rser | N346 | ohm | | 20/0.5 | The series resistance in device channel |
| VT | N3 | EXT | V | 20/0.5 | |
| VT | N3 | DI8 | SAT | 20/0.5 | Threshold voltage at saturation mode |
| GAM | N3 | | | 20/0.5 | Gammel value indicates the back bias effect |
| BET | N3 | Slo | uA/V ·· 2 | | Proportional to (mobility * gate capacitance) |
| Isat | N3 | F | mA | 20/0.5 | Drive current as transistors turn "ON" |
| Isub | N3 | | μA/μm | | The peak substrate current |
| Ioff | N3 | | pA/μm | | |
| BV | N3 | | V | 20/0.5 | The breakdown voltage as transistors turn "OFF" |
| SWI | N4 | 3.6 | mv/Dec. | | The slope of sub-threshold turn "ON" |
| Weff | N646 | | μm | .4/20 | The effective channel width |

The Beta (β) ratio can be improved by about 17% by the method of this invention.

In a 0.35 μm/3.3V SRAM experimental device, without the pass gate halo implant, the chip probe yield was about 0% at $V_{cc}$=2.7V In a 0.35 μm/3.3V SRAM experimental device, including the pass gate halo implant, the chip probe yield was about 60% at $V_{cc}$=2.7V Drive current equals "ON" current proportional to W/L, where:
 W=Channel width of MOSFET
 L=Channel length of MOSFET $$\beta = \frac{W_d/L_d}{W_p/L_p} \frac{\{W/L \text{ for pull down}\}}{\{W/L \text{ for pass gate}\}}$$

$L_d$ and $L_p$ are usually at the minimum design rule, e.g. at 0.35 μm generation $L_d=L_p$=0.35 μm.

There is a need to reduce $W_p$ but it is difficult because of the use of LOCOS in the SRAM/DRAM processes.

| PASS GATE CURRENTS | | | |
|---|---|---|---|
| | | Conventional | Boron ($B_{11}$) Halo implant |
| Saturation Drive Current $I_{DSAT}$ | (W/L) 0.4/0.5 | 0.159 mA | 0.135 mA |
| $I_{OFF}$ | 0.4/0.35 | 400 pA/$\mu$m* | 4 pA/$\mu$m** |

* very leaky current with conventional process as channel length shorter 0.15
** low leakage While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An SRAM transistor cell comprising:
    a doped semiconductor substrate with an N-well and NMOS transistors including a pass transistor and a second transistor formed in a P-well with a halo region in said pass transistor and no halo region formed in said second transistor,
    a P-well and said N-well being formed in said doped semiconductor substrate with FOX regions formed on said substrate,
    a gate oxide layer formed over said doped semiconductor substrate aside from said FOX regions,
    annealed polysilicon gate electrodes formed over said gate oxide layer between said FOX regions,
    spacers formed adjacent to said gate electrodes,
    N+ source/drain regions implanted into said P-well and P+ source/drain regions implanted into said N-well, said source/drain regions being self-aligned with said spacers,
    said N+ source/drain regions being doped with arsenic N type dopant with a concentration from about 1 E 19 atoms/cm$^3$ to about 1 E 20 atoms/cm$^3$
    N type LDD regions implanted into said P-well beneath said spacers doped with phosphorus N type dopant with a concentration of phosphorus atoms from about 1 E 18 atoms/cm$^3$ to about 1 E 19 atoms/cm$^3$,
    P type doped halo regions implanted into said pass transistor beneath said N-type LDD regions in said P-well, said P type doped halo regions being doped with boron type dopant with a concentration of boron atoms from about 1 E 18 atoms/cm$^3$ to about 1 E 19 atoms/cm$^3$, and
    P type LDD regions formed in said N-well.

2. The cell in accordance with claim 1 including said halo regions comprising implanted boron $B_{11}$.

3. The cell in accordance with claim 1 including:
    said P-type LDD regions in said N-well adjacent to said P-well covered by spacers adjacent to said gate electrode.

4. The cell in accordance with claim 1 including:
    said N-type LDD implanted regions in said P-well comprising phosphorus,
    said P-type LDD regions in said N-well adjacent to said P-well, and
    said halo implanted regions being P type boron $B_{11}$ implanted regions.

5. The cell in accordance with claim 1 including:
    said N-type LDD implanted regions having been doped with phosphorus,
    said halo implanted regions being a boron $B_{11}$ implanted regions, and
    said P-type LDD regions below spacers adjacent to said gate electrode.

6. An SRAM transistor cell comprising:
    an N-type doped semiconductor substrate,
    an N-well and a P-well formed in said N-type doped semiconductor substrate,
    a pass transistor and a second transistor formed in said P-well with a halo region below LDD regions of said pass transistor and no halo region formed in said second transistor,
    field isolation regions formed on the surface of said substrate,
    threshold voltage regions implanted in said substrate,
    a gate oxide layer formed over said doped semiconductor substrate,
    polysilicon gates formed on said substrate
    P type implanted LDD regions in a N-well transistor device juxtaposed with P+ source/drain regions and otherwise directly exposed to the N-well without any halo region,
    spacers formed adjacent to said gate electrodes,
    N type LDD regions formed in said P-well transistor devices with a concentration of phosphorus from about 1 E 18 atoms/cm$^3$ to about 1 E 19 atoms/cm$^3$,
    halo regions ion implanted below said spacers into said pass transistor in said P-well with a concentration of boron from about 1 E 18 atoms/cm$^3$ to about 1 E 19 atoms/cm$^3$,
    N+ source/drain regions ion implanted into said P-well in said doped semiconductor substrate self-aligned with said spacers with a concentration from about 1 E 19 atoms/cm$^3$ to about 1 E 20 atoms/cm$^3$,
    P+ source/drain regions formed in said N-well in said doped semiconductor substrate self-aligned with said spacers.

7. The cell of claim 6 wherein said halo regions were implanted with a boron $B_{11}$ implant.

* * * * *